United States Patent [19]

Sakai et al.

[11] Patent Number: 4,945,222
[45] Date of Patent: Jul. 31, 1990

[54] LIGHT IRRADIATION CONTROL DEVICE FOR USE IN IMAGE RECORDING APPARATUS

[75] Inventors: Toshio Sakai; Michitoshi Akao, both of Nagoyo, Japan

[73] Assignee: Brother Kogyo Kabushiki Kaisha, Japan

[21] Appl. No.: 259,341

[22] Filed: Oct. 18, 1988

[30] Foreign Application Priority Data

Oct. 20, 1987 [JP] Japan .................. 62-264830
Feb. 25, 1988 [JP] Japan ................... 63-42944

[51] Int. Cl.$^5$ .................................... G01J 1/32
[52] U.S. Cl. .......................... 250/205; 250/223 R
[58] Field of Search ........... 250/205, 223 R; 355/68, 355/74, 38

[56] References Cited

U.S. PATENT DOCUMENTS

| 3,650,624 | 3/1972 | Yamada | 355/69 |
| 4,206,998 | 6/1980 | Tokuda | 355/77 |
| 4,270,861 | 6/1981 | Beckman | 355/38 |

FOREIGN PATENT DOCUMENTS 842573 7/1960 United Kingdom .
1366161 9/1974 United Kingdom .
1528195 10/1978 United Kingdom .
1547926 7/1979 United Kingdom .

Primary Examiner—David C. Nelms
Assistant Examiner—Stephone B. Allen
Attorney, Agent, or Firm—Oliff & Berridge

[57] ABSTRACT

A light irradiation control device for use in an image recording apparatus is disclosed. In one embodiment, the image recording apparatus uses an intermediate sheet on which a mask image is formed at a laser printer. The mask image is introduced into the apparatus and is in surface contact with a photosensitive pressure sensitive recording medium. The light transmission factor of the intermediate sheet is detected by a detection means, and a signal indicative of the factor is sent to a control unit. The control unit control amount of light irradiation against the photosensitive pressure sensitive recording medium through the intermediate sheet. In another embodiment, a light transmitted through an original is directly applied onto the photosensitive pressure sensitive recording medium. The amount of light irradiated onto the original is controlled by detecting a thickness of the original and irradiating a controlled amount of light responsive to the detection.

9 Claims, 2 Drawing Sheets

LIGHT IRRADIATION CONTROL DEVICE FOR USE IN IMAGE RECORDING APPARATUS

BACKGROUND OF THE INVENTION

The present invention relates to a light irradiation control device for use in an image recording apparatus. More particularly, this invention relates to a device for controlling light irradiation againt an original or an image recording medium in response to thickness and material of the original or an intermediate masking member for use in the image recording apparatus.

In a conventional color image recording apparatus, a photosensitive recording medium is properly exposed to light through an intermediate mask member on which a mask image is provided. This light exposure is provided irrespecitive of the light transmission factor of the mask member.

Further, a color image recording apparatus using such mask member is proposed in a commonly assigned copending U.S. patent application Ser. No. 184,576 filed on Apr. 21, 1988. According to this apparatus, used is a transfer type image recording mediums disclosed in U.S. Pat. No. 4,399,209. Each of the mask members carrying an image corresponding to three colors outputted from a monochroprinter is brought in intimate contact with a photosensitive pressure-sensitive recording medium, and then the photosensitive pressure-sensitive recording medium is exposed to light through the mask member, thereby forming a color latent image on the recording medium. Subsequently, a separate image recording medium such as a developer sheet is placed on the photosensitive pressure sensitive recording medium, and these recording mediums are pressed together by a pressure developing unit. As a result, a color image is formed on the developer sheet.

According to the image recording apparatus disclosed in the copending application, the light transmission factor of the mask member have to be constant at all times for providing a desirable output image on the developer sheet. If used is a different type of the mask member having the light transmission factor different from that of the oridinary mask member, it is necessary to manually readjust the light irradiation intensity or light irradiation time. Such adjustment may be intriate and troublesome.

In another aspect, in the conventional image recording apparatus, an original is placed on an original support stand, end light is irradiated onto the original so as to provide a latent image on a photosensitive recording medium. In the conventional apparatus, light amount or intensity is normally kept constant irrespective of thickness of the original. However, since the light is transmitted through the original, and such transmitted light is introduced to an exposure unit for exposing the photosensitive recording medium to light, the quality of the output image may be changeable in response to the thickness of the original. For example, only a limit amount of light may be transmitted through the origianl if the original has a large thickness, thus deteriorating the quality of the output image.

SUMMARY OF THE INVENTION

With these above drawbacks in view, it is an object of the present invention to provide a light irradiation control device for use in an image recording apparatus in which a constant color image can be formed irrespective of the kind and thickness of the mask member.

Another object of the invention is to provide a light irradiation control device for use in an image recording apparatus which device is capable of providing high quality output image regardless of variety of thickess of every original and even if an original having large thickess which has low light transission characteristic is installed at an exposure portion.

To attain these objects, according to this invention there is provided a light irradiation control device for use in an image recording apparatus which includes an exposure unit including a light source, and a pressure developing unit, the image recording apparatus employing an image recording medium on which an image corresponding to an image of an original is provided, and the device comprising; a detection means for detecting one of light transmission factor of the image recording medium and thickness of the original and for generating an output signal indicative of one of the light transmission factor and the thickness; and, a control means connected between the detection means and the light source for controlling light irradiation amount of the light source in response to the output signal. The light is directed to the image recording medium when the light transmission factor is detected, and the light is directed to the original when the thickness thereof is detected.

According to a first embodiment of the invention, the image recording medium comprises a photosensitive pressure sensitive recording medium, a developer medium and an intermediate recording medium on which mask image corresponding to colors of the original is formed. The light transmission factor of the intermediate recording medium is detected by the detection means prior to light exposure, and controlled amount of light responsive to the detection is irradiated onto the photosensitive pressure sensitive recording medium through the intermediate recording medium. Therefore, even if one of the intermediate recording mediums each having light transmission factor different from each other is used, a final output image on the developer mediumn has good quality.

According to a second embodiment of this invention, the intermediate recording medium is not used, but a light from the light source is transmitted through the original and is directed directly toward the photosensitive pressure sensitive recording medium. In this case, the detection means detects the thickness of the original prior to light exposure, and generates output signal indicative of the thickness. This output signal is sent to the control means so as to control light irradiation amount toward the original. Therefore, even if one of the originals having thickness different from each other is installed for exposure, final output image on the developer sheet has good quality. In a modification, the detection signal indicative of the thickness is transmitted to an alarm unit of the control means. If the detection signal exceeds a predetermined level, the alarm unit generates an alarm signal, so that an operator can suspend image recording operation.

DETAILED DESCRIPTION OF THE PREFERRED EMBODIMENTS

Figure 1:
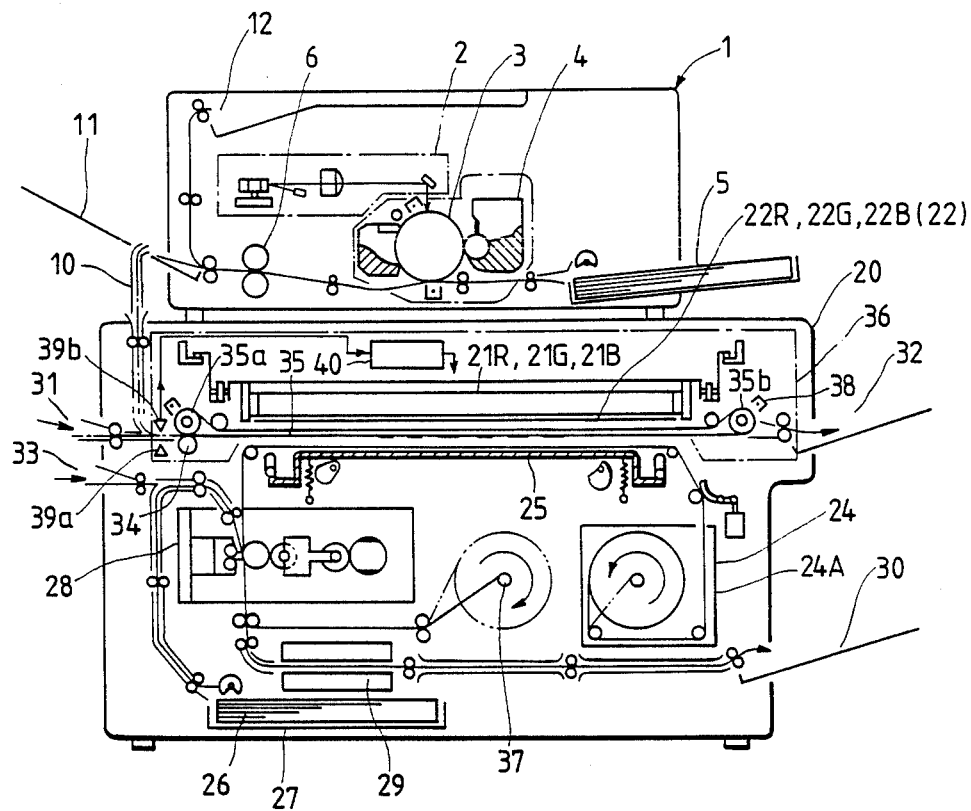
FIG. 1 is a schematic cross-sectional elevation showing an image recording apparatus incorporating a light irradiation control device against a mask member according to a first embodiment of this invention.

A first embodiment according to this invention will be described with reference to FIG 1. A light irradiation control device according to the first embodiment is installed in an image recording apparatus which uses a transfer type image recording medium as disclosed in U.S. Pat. No. 4,399,209 wherein the developer material is coated on a separate substrate as a separate developer or copy sheet. In the transfer type image recording medium, first end second image recording mediums are provided. The first image recording medium comprises a photosensitive pressure sensitive recording medium provided with microcapsules, and the microcapsules encapsulate therein a first material having first and second phases dependent on light exposure. The second image recording medium comprises a developer medium provided with a second material which provides an output image upon reaction with the first material. Further, the image recording medium uses an intermediate mask member generally designated by the reference numeral 22. Similar to the above-described co-pending U.S. patent application, the image recording apparatus is operably connected with a monochroprinter 1.

This monochroprinter is a monochromatic laser printer 1 in which a polygon scanner 2 applies laser light over a charged photosensitive drum 3 to form an electrostatic latent image thereon. Ordinarily, the monochromatic laser printer stores an image data transmitted from a host computer (not shown), so that this electrostatic latent image is provided in response to, this image data. The photosensitive drum 3 is then subjected to development by a developing unit 4, whereupon a toner image on the photosensitive drum 3 is transferred onto an intermediate recording medium such as a plain paper or an overhead projection (OHP) sheet supplied from a sheet cassette 5. The toner image is then fixed on the paper by an image fixing unit 6. If a user simply needs a monochromatic output image recorded on the OHP sheet 22, this sheet is discharged out of a discharge tray 11 or 12. On the other hand, if the user needs a color image, the OHP sheet 22 carrying the monochromatic image is delivered to a color image recording apparatus 20, so that the OHP sheet is used as an intermediate sheet or a mask member 22R, 22G or 22B.

The color image recording apparatus 20 generally includes an exposure unit 36, a pressure developing unit 28, and a thermal fixing unit 29. A path change-over unit 10 is provided betwen the laser printer 1 and the image recording apparatus 20 for changing one sheet path to another in order to feed the mask members 22R, 22G and 22B (hereinafter simply referred to as "itermediate sheets 22) from the monochromatic layer printer I to the exposure unit 36. An exposure table 25 is disposed below the exposure unit 36, and a continuous web like photosensitive pressure sensitive image recording medium 24 is accommodated in a sheet roll cassette 24A. The continuous web 24 is taken up by a take-up roller 37. In the photosensitive pressure sensitive image recording medium 24, coated are microcapsules each encapsulating therein chromogeneic material reactable with a developer material of a developer sheet (described later) upon rupture of the microcapsules. This image recording medium 24 is delivered onto the exposure table 25, and the intermediate sheet 22 carring thereon the mask image is to be brought in intimate contact with the image recording medium 24.

In the exposure unit 36, there are provided an endless conveyor 35 and a static electricity generator 38 as a corotoron. The conveyor belt is formed of an electrically insulating material such as polyethylene (PET). The mask member can stick to the conveyor belt 35 by a static electricity generated by the corotoron 38. The endless conveyor 35 is travelled by a pair of rollers 35a and 35b and undergoes electrical charging by the corotoron 38, so that the intermediate sheet 22 Can be electrically stuck to the conveyor 35. The exposure unit 36 also provides three primary color light sources 21R, 21G and 21B for exposure to the photosensitive pressure sensitive recording medium 24 through the intermediate sheet 22.

A developer sheet cassete 27 is provided at a lowermost portion of the apparatus 20, and a stack of developer sheets 26 is accommodated in the cassette 27. The developer sheet 26 is delivered to an immediately upstream side of the pressure developing unit 28, and is in facial contact with the photosensitive pressure sensitive recording medium 24.

A tray 31 is positioned at one side of the exposure unit 36 for manually supplying the intermediate sheet carrying the mask image onto the conveyor 35. An intermediate sheet discharge tray 32 is positioned at another side of the exposure unit 36 for receiving the intermediate sheet 22 which has been passed through the exposure unit 36. Further, a developer sheet tray 33 is provided at one side of the apparatus 20 for manually supplying the developer sheet 26 toward &he pressure developing unit 28, and another tray 30 is disposed at another side of the apparatus 20 for receiving the developer sheet 26 on which a final output image is provided.

In accordance with the first embodiment of this invention, there is provided a photo-detecting unit including a light emitter 39a and a light receive 39b. The photo-detecting unit 39 is positioned at an inlet portion at which the intermediate sheet 22 is first introduced into the exposure unit 36 for detecting the light transmission factor of the intermediate sheet. That is, the inlet portion may be positioned immediate downstream of a junction defined by the manual tray 31 and the change-over path 10. Further, a control board 40 is provided which has one end connected to the light receiver 39b and another end connected to the light source 21 for calculating and controlling the exposure intensity. The photo-detecting unit 39 and the control board 40 provide a control device for controlling light irradiation to the photosensitive pressure sensitive recording medium 24 at the exposure unit 36. A position fixing roller 34 is rotatably provided at position immediate downstream of the photo-detecting unit 39 so as to perform position adjustment with respect to a leading edge of the intermediate sheet 22. The above described roller 35a also serves as a position fixing roller in cooperation with the roller 34.

Next, color mode function will be described. The mask member 22R on which a toner image corresponding to red color is formed by the monochromatic laser printer 1 is fed past the path change over unit 10, and then the leading end of the mask member 22R is subjected to position alightment by the position fixing rollers 34 and 35a. (In case of the manual insertion of the mask member 22R, the latter is fed into the manual tray 31 and undergoes position alightment by the rollers 34 and 35a.) At the time, in an area other than the toner imaging area of the mask member 22R, light is emitted from the light emitter 39a and is transmitted through the non-image area. As a result, only the transmitted light is received by the light receiver 39b. Upon receipt of the light, the receiver 39b issues an electrical signal corresponding to the amount of light having passed through the mask member 22R, to the control board 40 where a suitable degree of exposure intensity is determined by the caluclation of the electrical signal. In the meantime, the mask member 22R is conveyed to the exposure portion of the exposure unit 36 by the movement of the endless conveyor 35 since the mask member is electrically stuck to the conveyor 35 by means of the static electricity generator 38. By moving the conveyor 35, the mask member 22R is located so as not to cause a color shift in a color latent image formed on the photosensitive pressure sensitive recording medium 24. In the exposure unit 36, the mask member 22R and the photosensitive pressure sensitive recording medium 24 are brought into intimate contact with each other by the exposure table 25, and are exposed by the light source 21R which generates optimum light intensity upon control by the control boad 40 in response to the light transmission factor of the mask member 22R. Therefore, a latent image corresponding to the toner image on the mask member 22R is formed on the photosensitive pressure sensitive recording medium 24.

After exposure, the mask member 22R is discharged onto the discharge tray 32, and in like manner, a color latent image corresponding to each of the mask members 22G end 22B is formed on the photosensitive pressure sensitive recording medium 24. Thereafter, the photosensitive pressure sensitive recording medium 24 carrying three latent images on the identical portion thereof is fed to the pressure developing unit 28. In this time, the developer sheet 26 is fed toward the pressure developing unit 28 from the sheet cassette 27 or the manual insertion tray 33. The photosensitive pressure sensitive recording medium 24 and the developer sheet 26 are superposed with each other and are pressed by the pressure developing unit 28, so that unexposed microcapsules are ruptured to react with their chromogenic materials (first material) with the developer materials (second material) of the developer sheet 26, to thereby provide a color image on the developer sheet 26. After the development, the developer sheet 26 is discharged onto the discharge tray 30 via the thermal fixing unit 29 where glossy color image is provided on the developer sheet, whereas the used photosensitive pressure sensitive recording medium 24 is taken up by the take up roller 37.

According to the first embodiment of the invention, various changes and modifications may be effected. For example, the printer 1 is not limited to the monochromatic laser printer 1, and may be of any other type such as an light emitting diode (LED) printer, a light crystal printer or a thermal-transfer printer provided that it is capable of producing trichromatic resulution originals. Further, a desk-top printer may be mounted on the top of the image recording apparatus 20 and may be operably coupled therewith. If a separate large-sized printer is used, trichromatic resolution originals produced by the separate printer may be supplied into the image recording apparatus 20 via the insertion tray 31.

In the first embodiment, used is the transfer type image recording medium which is the combination of the photosensitive pressure sensitive recording medium 24 and the developer medium 26. However, a self-contained type image recording medium is also available. The self-contained type is disclosed in, for example, U.S. Pat. No. 4,440.846 wherein an encapsulated chromogenic material or dye precursor and a developer material are co-deposited on one surface of a single substrate as one layer or as two contiguous layers.

Further, the light receiver 39b and the light emitter 39a for detecting the light transmission factor of the intermediate sheet 22 may be any other type which can detect the light transmission factor. For example, the light receiver 39b may be a photodiode, a phototransistor or a CdS cell. The light receiver 39a may be also used as the position adjustment unit for aligning the leading edge of the mask member instead of the rollers 34 and 35a. The light emitter 39a may be a miniture lamp or a luminous diode. Otherwise, the light sources 21R, 21G and 21B may also be used as the light emitter. In this case, it is possible to accurately provide the actual amount of exposure and to detect the actual light transmission factor of the individual mask member by the irradiation of the light from one of the light sources which light has color corresponding to the color on the mask member. Also in this case, light irradiation amount control is easily carried out by firstly changing the amount of emitting light from the individual light sources 21R, 21G and 21B, and then by maintaining the amount of emitting light when the light amount transmitted through the respective mask members reaches a predetermined value. Moreover, one of the three filters is selectively interposed between the light emitter 39a and the intermediate sheet 22. The selected filter is for example, red filter, if the red mask image 22R is introduced and red light source 21R is used as the light source of the emitter 39a for the detection of the light transmission factor of the mask member 22R under the restriction to the spectral characteristic. By such method, the same result can be obtained. However, when using the color filters, it is necessary to change the color filter each time the mask member is changed, and alternatively, it is necessary to dispose different filters on three light receivers, and to electrically change-over one light receiver to another among three light receivers at every introduction of the mask members.

In the first embodiment, the control board 40 controls light irradiation intensity. However, since this control is performed so that the photosensitive pressure sensitive image recording medium 24 can be exposed so as not to be affected by the material of the intermediate sheet 22, other type of irradiation amount control is also available. For example, the control board 40 may control the light scanning speed, the number of scanning in the exposure, or the total time of the exposure. Further, the control board 40 may control both the light irradiation intensity and irradiation time.

For receiving an electrical signal from the light receiver 39b for the control to the light sources 21R, 21G. 21B, the control board 40 may be composed of only a hardware, i.e., electrical circuits, or may have the assistance of software using a microcomputer. Further, in the case where the light transmission factor is considered to be inappropriate or erroneous for exposure as a result of the detection of the light transmission factor of the intermdiate sheet, namely, the control board 39 issues an error signal if the value of the light transmission factor exceeds a predetermined upper value or is below a predetermined lower limit. According to this error signal, it is possible to stop exposure operation or to discharge the intermediate sheet or to indicate this error information on a display panel so that the operator may take an appropriate action. This monitoring system is not mandatorily disposed in the control board 40 but may be disposed in a separate monitoring board.

Furthermore, in order to invesitgate the light transmission factor of the intermediate sheet, such light irradiation amount control apparatus is disposed in the printer where the mask image is produced on the intermediate sheet. The provision of such control apparatus in the printer may also be considered to belong to the present invention. In the latter case, such investigation may take place only once when installing the intermediate sheet on the printer.

As is apparent from the foregoing description, according to the first embodiment of this invention, it is possible to obtain a constant color image regardless of the kind and thickness of the intermediate sheet by using the detector means for detecting the light transmission factor of the intermediate sheet and the control means for controlling light irradiation amount to the photosensitive pressure sensitive image recording medium. Consequently, it is possible to choose an appropriate sheet for the masking member.

A second embodiment according to this invention will next be described with reference to FIGS. 2 and 3. Similar to the first embodiment, the transfer type image recording medium as described in U.S. Pat. No. 4,399,209 is used in the second embodiment. However, other type of recording medium such as the self-contained type is also available with a minor modification to the image developing and fixing units and without any modification to an exposure unit.

At a lower portion of an image recording apparatus 101, a light source 119 is disposed movable in a horizontal direction. The light source 119 may be a halogen lamp connected to a 100 V A.C. power source. A holder is provided above the light source 119 for holding an original (not shown) in the holder. The holder 111 is formed of light transmissive material and is movable in the horizontal direction. At one side of the apparatus 101, a gate 121 is provided through which the holder 111 is inserted into the recording apparatus 101.

A vertically movable exposure stand 109 is disposed above the holder 111. A projecting portion extends upwardly from an intermediate portion of the exposure stand 109 and an engaging portion 109a is provided at a tip end of the prouecting portion. Further, a stand supporting member 108 is disposed above the exposure stand 109 for movably suspending the same. At least one compression spring 110 is disposed between the supporting member 108 and the exposure stand 109 for normally urging the stand 109 downwardly (toward the holder 111). At an upper one side portion of the supporting member 108, a sheet roll cassette 102 is supported for accommodating therein a roll of photosensitive pressure sensitive recording medium 103. Further, a take-up roller 104 is rotatably supported at a position above an upper another side portion of the supporting member 108 for winding the photosensitive pressure sensitive recording medium 103.

An auxiliary clamping arm 107 is pivotally disposed at a position between the take-up roller 104 and the supporting member 108. The auxiliary clamping arm 107 has one end engageable with the engaging portion 109a of the exposure stand 109, and having another end. Further, a cam gear 105 is rotatably provided at a position beside one end of the supporting member 108. The cam gear 105 is rotable about an axis of a shaft 105a, and a cam 120 having an outer peripheral surface is provided rotatable about the axis together with the rotation of the cam gear 105.

A clamp arm 106 is pivotally supported at a position between the cam 120 and the auxiliary clamp arm 107, and above the supporting member 108. The clamp arm 106 has one end in surface contact with the outer peripheral surface of the cam 120 and another end engageable with the other end of the auxiliary clamp arm 107. A pair of a set of the cam 120, the clamp arm 106 and the auxiliary clamp arm 107 are provided at both lateral end portions of the apparatus in order to lift the exposure stand 109 againt biasing force of the spring 110 at two positions.

A pressure developing roler 112 is disposed between the supporting member 108 and the cam gear 105, and a separator roller 118 is disposed above the pressure developing roller 112. The photosensitive pressure sensitive recording medium 103 supplied from the cassette 102 is fed to the pressure developing roller 112 and the separator roller 118 through the lower surface of the supporting member 108, and is wound over the take-up roller 104.

A developer sheet cassette 114 is disposed below the light source 119, and a developer sheet stack 115 is accommodated in the cassette 114. Further, a feed roller 116 is provided at an opening of the developer sheet cassette 114 to take out the developer sheet 115. Above the feed roller 115, an arcuate guide member 117 is provided between the feed roller 116 and the pressure developing roller 112 so as to deliver the developer sheet 115 toward the pressure developing roller 112.

A detector 122 is disposed upwardly in the gate 121 for detecting the thickness of the original. For the detector 122, a well-known optical displacement sensor is used. While the original is pressed tightly on the upper surface of the holder 111 by a pressure roller (not shown), the thickness of the original is detected from a combined light spot defined by a light beam reflected on the surface of the original and another light beam reflected on the surface of the holder 111. The detector 122 outputs to a control unit 123 (described later) an electrical signal of a voltage varrying in proportion to the thickness of the original.

Figure 3:
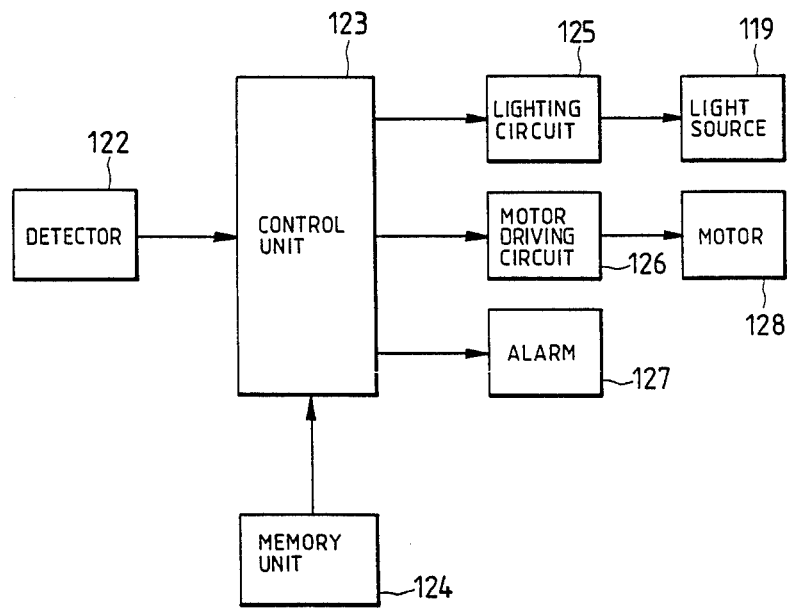

FIG. 3 is a block diagram showing an electrical system of the apparatus 101. The control unit 123 is connnected to a memory unit 124, a lighting circuit 125, a drive circuit 126 and an alarm device 127. The memory unit 124 stores therein a computer program for controlling the apparatus 101. The drive circuit 126 is connected to a drive motor 128 for moving the light source 119. The lighting circuit 125 is connected to the light source 119 for lighting the same. When lighting the light source 119 by the 100 V A.C. power source, the lighting circuit (including SCR or thyristor) 125 controls an firing angle of the power source within a range of from 0 to 180 degrees, to thereby vary the amount of light from the light source 119.

Further, the control unit 123 receives an electrical signal from the detector 122, and calculates the firing angle in response to the signal so as to output a calculated signal to the lighting circuit 125, to thereby control the light amount. Specifically, if the voltage of the electrical signal from the detector 122 is low (the original is thin), the control unit 123 reduces the firing angle to threby reduce the amount of light to be applied to the original. Reversely, if the voltage of the electrical signal is high (the original is thick), the control unit 123 increases the firing angle to thereby increase the amount of light. Further, if the voltage of the electrical signal is excessively higher than a predetermined value (the original is excessively thick), the control unit 123 renders the alarm device 127 to generate an audible sound.

The mode of operation according to the second embodiment will next be described.

Figure 2:
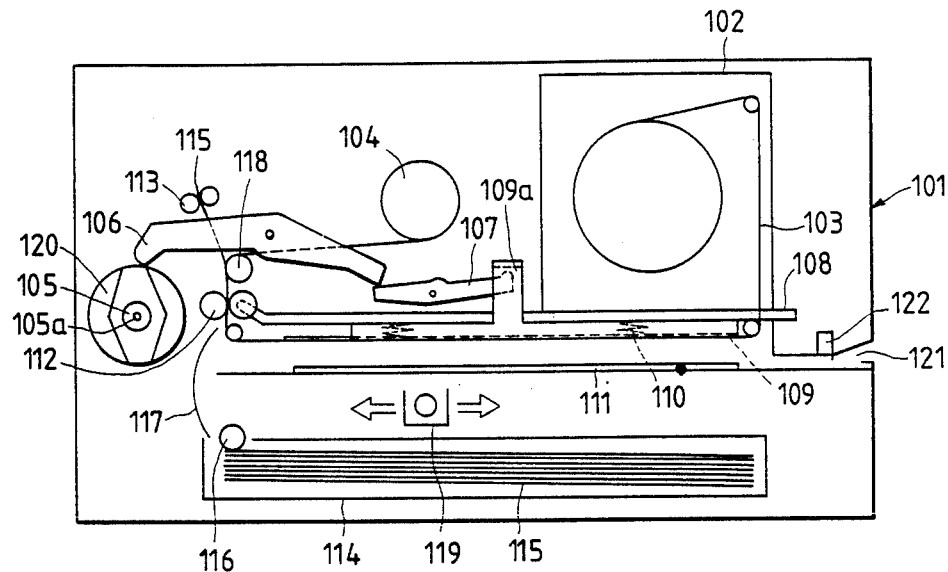
FIG. 2 is a schematic cross-sectional elevation showing another image recording apparatus incorporating a light irradiation control device against an original according to a second embodiment of this invention; and, FIG. 3 is a block diagram showing an electrical system according to the second embodiment of this invention.

In FIG. 2, the original (not shown) held on the original holder 111 is inserted into the apparatus 101 through the gate 121, whereupon the detector 122 detects the thickness of the original. If the detected thickness is over the predetermined value, a warning is isssued from the alarm device 127.

If the thickness of the original inserted is within the predetermined range, the cam shaft gear 105 is rotated by 90 degrees to turn the cam 120 by the same angle, thus permitting the clamp arm 106 to be pivotally moved in a first direction (counterclockwise direction in FIG. 2). By the pivotal movement of the clamp arm 106, the auxiliary clamp arm 107 is pivoted in a second direction (clockwise direction in FIG. 1) opposite to the first direction, Therefore, one end of the auxiliary clamp arm 107 is moved downwardly, so that the exposure stand 109 is moved downwardly by the biasing force of the compression spring 110. As a result, the photosensitive pressure sensitive recording medium 103 is brought into intimate contact with the holder 111 at uniform pressure.

With the original thus completely contacting the holder 111, the light source 119 is lighted under the controlled firing angle responsive to the thickness of the original. Subsequently, as the light source 119 is moved in the horizontal direction to expose the photosensitive pressure sensitive recording medium 103 to light through the original, a latent image corresponding to an image of the original is formed on the recording medium 103. Upon termination of exposure, the exposed photosensitive pressure sensitive recording medium 103 is moved to the developing and fixing units. At that time, if the recording medium 103 is moved as it is in contact with the holder 111, the surface of the recording meidum 103 would be easily damaged due to rubbing with the holder 111. To avoid this problem, the cam shaft gear 105 is further rotated by 90 degrees in the first direction or is reversely rotated by 90 degrees in the second direction to restore its original angular position. By this rotation, the clamp arm 106 is pivotted in the second direction, and the auxiliary clamp arm 107 is pivotted in the first direction to lift the exposure stand 109 upwardly against biasing force of the spring 110. As a result, the photosensitive pressure sensitive recording medium 103 is released from the pressure applied between the exposure stand 109 and the holder 111.

Then, the take-up roller 104 is driven to move the photosensitive pressure sensitive recording medium formed with the latent image. Simultaneously, the feed roller 116 is also driven to deliver the developer sheet 115 from the cassetted 114 to the pressure developing roller 112. The developer sheet 115 is overlaid with the photosensitive pressure sensitive recording medium 103, and these sheets 103 and 115 are pressed together by the pressure developing roller 112, so that the latent image on the photosensitive pressure sensitive recording medium 103 is transferred onto the developer sheet 115 to thereby provide a visual output image thereon. These two sheets are separated from each other at the separator roller 118. The separate developer sheet 115 is moved toward the thermal fixing roller 113 to obtain final output image, and is then discharged out of the apparatus 101.

According to a modification to the second embodiment, the light irradiation amount control is only made by suspending the light irradiation when the thickness of the original exceeds a predetermined level. In this case, it is unnecessary to change light irradiation amount. Upon detection of the thickness, this detection signal is transmitted to an alarm unit so that an operator can recognize the improper original so as to temporarily stop the image recording operation to thus avoid waste of the image recording medium. In this modification, much simple structure is obtainable.

Therefore, in the second embodiment, an operator can previously determine maximum thickness of the original capable of producing sufficient output image by the maxiumum light irradiation. Such maximum level is inputed to the control apparatus, and alarm can be generated if the applied original has a thickness exceeding the maixmum thickness. Accordingly, in the second embodiment, image recording operation can be suspended by the alarm so as to avoid waste of the recording medium and waste of entire operation time. Further, if the thickness of the original is within the predetermined range, the amount of the light from the light source 119 can be varried in response to the thickness. Therefore, the output image having excellent quality is obtainable at all time of the image recording operation.

What is claimed is:

1. A light irradiation control device for use in an image recording apparatus which includes an exposure unit including e light source, and a pressure developing unit, said image recording apparatus employing an image recording medium on which an image corresponding to an image of an original is provided, said device comprising;
    a detection means for detecting one of light transmission factor of said image recording medium and thickness of said original and for generating an output signal indicative of one of said light transmission factor and said thickness prior to light application to said image recording medium; and,
    a control means connected between said detection means and said light source for controlling light irradiation amount of said light source in response to said output signal, said light being firsty directed to one of said image recording medium and said original.

2. The light irradiation control device as claimed in claim 1, wherein said light irradiation amount control is performed by controlling at least one of light irradiation intensity and light irradiation time.

3. The light irradiation control device as claimed in claim 1, wherein said image recording medium comprises a first image recording medium and a second image recording medium, said first image recording medium comprising a photosensitive pressure sensitive recording medium provided with microcapsules, said microcapsules encapsulating therein a first material having first and second phases dependent on light exposure, and said second image recording medium comprising a developer medium provided with a second material which provides an output image upon reaction with said first material.

4. The light irradiation control device as claimed in claim 3, wherein said image recording medium further comprises an intermediate recording medium, and wherein said image recording apparatus is connected to a printer on which a mask image corresponding to each of colors is provided on said intermediate recording medium, said detection means detecting said light transmission factor of said intermediate recording medium, said intermediate recording medium being in intimate contact with said first image recording medium at said exposure unit, so that a latent image corresponding to said mask image is formed on said first image recording medium.

5. The light irradiation control device as claimed in claim 4, wherein said detection means is positioned at an upstream side of said exposure unit.

6. The light irradiation control device as claimed in claim 4, wherein said detection means is variable in spectral characteristic corresponding to each of said intermediate recording mediums.

7. The light irradiation control device as claimed in claim 4, wherein said detection means further comprises a monitor means for issuing an error signal when said output signal exceeds a predetermined level.

8. The light irradiation control device as claimed in claim 3, wherein a latent image is formed on said first image recording medium by a light emitted from said light source and transmitted through said control, and wherein said detection means detects said thickness of said original.

9. The light irradiation control device as claimed in claim 8, wherein said control means further comprising means for issuing a warning signal when said thickness exceeds a predetermined thickness.

* * * * *